(12) United States Patent
Ohno

(10) Patent No.: US 8,865,584 B2
(45) Date of Patent: Oct. 21, 2014

(54) SEMICONDUCTOR DEVICE AND MANUFACTURING METHOD THEREOF

(75) Inventor: Hirotaka Ohno, Miyoshi (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 304 days.

(21) Appl. No.: 13/387,910

(22) PCT Filed: May 18, 2010

(86) PCT No.: PCT/JP2010/058374
§ 371 (c)(1),
(2), (4) Date: Jan. 30, 2012

(87) PCT Pub. No.: WO2011/145176
PCT Pub. Date: Nov. 24, 2011

(65) Prior Publication Data
US 2012/0126411 A1    May 24, 2012

(51) Int. Cl.
*H01L 21/44* (2006.01)
*H01L 23/00* (2006.01)
*H01L 21/48* (2006.01)
*H01L 23/492* (2006.01)

(52) U.S. Cl.
CPC ..... *H01L 23/492* (2013.01); *H01L 2924/01033* (2013.01); *H01L 2924/01004* (2013.01); *H01L 2924/01047* (2013.01); *H01L 2224/26175* (2013.01); *H01L 2924/014* (2013.01); *H01L 2224/83193* (2013.01); *H01L 2924/01029* (2013.01); *H01L 2224/83007* (2013.01); *H01L 2924/01079* (2013.01); *H01L 2924/01006* (2013.01); *H01L 24/27* (2013.01); *H01L 24/32* (2013.01); *H01L 2224/27013* (2013.01); *H01L 2224/83385* (2013.01); *H01L 24/83* (2013.01); *H01L 2224/33505* (2013.01); *H01L 21/4875* (2013.01); *H01L 2924/0105* (2013.01); *H01L 2224/32225* (2013.01); *H01L 24/743* (2013.01); *H01L 24/29* (2013.01); *H01L 2924/13055* (2013.01); *H01L 2924/01013* (2013.01); *H01L 2224/29099* (2013.01)
USPC ......................................................... 438/612

(58) Field of Classification Search
CPC ............ H01L 2224/27013; H01L 2224/27019
USPC ......................................................... 438/612
See application file for complete search history.

(56) References Cited

U.S. PATENT DOCUMENTS 5,055,911 A * 10/1991 Ogata ........................... 257/711
5,517,162 A *  5/1996 Ariyoshi ....................... 333/222
(Continued)

FOREIGN PATENT DOCUMENTS

JP          01-170090 A       7/1989
JP          04-096256 A       3/1992
(Continued)

OTHER PUBLICATIONS

International Search Report of PCT/JP2010/058374 mailed Jun. 15, 2010.

*Primary Examiner* — Nicholas Tobergte
(74) *Attorney, Agent, or Firm* — Kenyon & Kenyon LLP

(57) ABSTRACT

A semiconductor device of the present invention has a purpose to form a structure of preventing outflow of solder at low costs. A semiconductor element is bonded to a substrate through a solder layer. An outflow-preventing part is provided to surround the solder layer to prevent solder outflow during soldering. The outflow-preventing part is formed by a cold spray method and has a surface in an oxidized state.

6 Claims, 6 Drawing Sheets

(56) References Cited

U.S. PATENT DOCUMENTS

| | | | |
|---|---|---|---|
| 6,528,879 B2 * | 3/2003 | Sakamoto et al. | 257/729 |
| 6,808,755 B2 * | 10/2004 | Miyamoto et al. | 427/446 |
| 7,758,916 B2 * | 7/2010 | Schmid et al. | 427/191 |
| 7,832,177 B2 * | 11/2010 | Stark | 52/788.1 |
| 7,956,716 B2 * | 6/2011 | Tada et al. | 338/162 |
| 8,414,977 B2 * | 4/2013 | Ikejiri | 427/282 |
| 8,436,461 B2 * | 5/2013 | Ohno | 257/692 |

FOREIGN PATENT DOCUMENTS

| | | |
|---|---|---|
| JP | 06-177290 A | 6/1994 |
| JP | 06-244224 A | 9/1994 |
| JP | 08-023002 A | 1/1996 |
| JP | 2006-319146 A | 11/2006 |
| JP | 2008-124158 A | 5/2008 |
| JP | 2008-172066 A | 7/2008 |
| JP | 2009-026953 A | 2/2009 |

* cited by examiner

SEMICONDUCTOR DEVICE AND MANUFACTURING METHOD THEREOF

CROSS-REFERENCE TO RELATED APPLICATIONS

This is a 371 national phase application of PCT/JP2010/058374 filed on 18 May 2010, the entire contents of which are incorporated herein by reference.

TECHNICAL FIELD

The present invention relates to a semiconductor device in which a semiconductor element bonded to a substrate by solder and more particularly to a semiconductor device in which an outflow-preventing part is formed around a solder layer by a cold spray method to prevent outflow of solder, and a manufacturing method thereof

BACKGROUND ART

A semiconductor device 100 shown in FIG. 10 has a semiconductor element 101 such as IGBT mounted thereon. Since the semiconductor element 101 generates a large amount of heat, a substrate 102 is formed of a metal base substrate made of such as aluminum and copper having good thermal conductivity and electric conductivity or a substrate formed of a ceramic board. In the case of bonding the semiconductor element 101 to an upper surface of the substrate 102 by solder, a back surface of the semiconductor element 101 made of silicon is subjected to a metalization treatment using nickel alloy or the like in order to improve bonding strength with a solder layer 103. Further, a plated layer 104 is formed by nickel plating on a surface of the substrate 102 made of metal.

For instance, on the substrate 102 formed of a copper plate by press working, an outflow-preventing layer 105 is formed to ensure the coating thickness of the solder layer 103 to prevent solder from flowing out. The outflow-preventing layer 105 is made in such a way that a part of the substrate 102 which is not to be coated is masked and an exposed surface is coated by a spraying device. As a coating method of forming the outflow-preventing layer 105, a spraying method that forms a relatively stably thick coat (50 μm or less) is used. For the outflow-preventing layer 105, oxides such as aluminum, silicon, and titanium are used. The outflow-preventing layer 105 on the substrate 102 is formed to surround the semiconductor element 101 so that the outflow-preventing layer 105 hold back molten solder to prevent solder outflow.

RELATED ART DOCUMENTS

Patent Documents

Patent Document 1: JP 6(1994)-177290A
Patent Document 2: JP 2006-319146A

DISCLOSURE OF THE INVENTION

Problems to be Solved by the Invention

In the conventional semiconductor device 100, the outflow-preventing layer 105 is formed by spraying. The spraying method is achieved by melting metal powder and spraying the molten metal onto a substrate. Accordingly, the substrate is liable to be largely thermally affected. Thus, this method is not preferable. Further, spraying has to be performed for example in a chamber with a large pressure-reducing degree or the like, needing high costs for coating. This would result in an increase in price of the semiconductor device 100. Furthermore, since the substrate 102 is heated by the heat of molten material powder, additional works such as a cooling treatment would be required after coating (film or layer formation).

The present invention has been made to solve the above problems and has a purpose to provide a semiconductor device configured at low costs to prevent solder outflow and a manufacturing method thereof.

Means of Solving the Problems

To achieve the above purpose, one aspect of the invention provides a semiconductor device in which a semiconductor element is bonded to a substrate through a solder layer, wherein the semiconductor device includes an outflow-preventing part surrounding the solder layer to prevent outflow of solder during soldering, the outflow-preventing part being formed by a cold spray method and having an oxidized surface.

In the above semiconductor device, preferably, the outflow-preventing part is an outflow-preventing layer formed around the solder layer by the cold spray method.

In the above semiconductor device, preferably, a solder bonding layer is formed on the substrate, the semiconductor element is bonded to the solder bonding layer through the solder layer, and the outflow-preventing part is an outflow-preventing layer formed along a periphery of the solder bonding layer by the cold spray method.

In the above semiconductor device, preferably, the outflow-preventing layer is formed with a thickness higher than the solder layer.

In the above semiconductor device, preferably, a solder bonding layer is formed on the substrate, the semiconductor element is bonded to the solder bonding layer, and the outflow-preventing part is an outflow-preventing layer foamed on the solder bonding layer by the cold spray method.

In the above semiconductor device, preferably, the outflow-preventing layer is formed with a thickness higher than the solder layer.

In the above semiconductor device, preferably, the solder bonding layer is made of metal that is oxidized during layer formation and then subjected to a reduction treatment, and the outflow-preventing layer is made of metal that is oxidized during layer formation and left oxidized.

In the above semiconductor device, preferably, the solder bonding layer is formed by the cold spray method.

In the above semiconductor device, preferably, a solder bonding layer is formed on the substrate by the cold spray method, the semiconductor element is bonded to the solder bonding layer through the solder layer, and the solder bonding layer has a surface having been oxidized during layer formation, the surface including a reduced region on which the solder layer is located, the reduced region having been reduced by heat in a reducing gas, and the outflow-preventing part is a region of the surface left oxidized around the reduced region.

In the above semiconductor device, preferably, a solder bonding layer is formed on the substrate by the cold spray method, the semiconductor element is bonded to the solder bonding layer through the solder layer, and the outflow-preventing part is an oxidized region of a surface of the solder bonding layer subjected to a reduction treatment, the oxidized region having been oxidized by heat in an oxidizing gas to surround a region of the surface in which the solder layer is located.

Another aspect of the invention provides A method of manufacturing a semiconductor device by bonding a semiconductor element onto a substrate through a solder layer by soldering while preventing outflow of molten solder, the method comprising: forming an outflow-preventing part in a region surrounding the solder layer on the substrate by coating using a cold spray method, the outflow-preventing part having an oxidized surface, and soldering the semiconductor element by placing a solder material in a position surrounded by the outflow-preventing part and melting the solder material by heat.

In the above manufacturing method of a semiconductor device, preferably, the method uses two masks, each mask being formed with an opening corresponding to the outflow-preventing part between a central blocking part corresponding to the solder layer and an outer circumferential part corresponding to an outer region surrounding the outflow-preventing part, and a connecting part extending across the opening to connect the central blocking part and the outer circumferential blocking part, the connecting parts of the masks being located in different positions from each other, and the method includes forming the outflow-preventing part by the cold spray method by alternately using the two masks.

In the above manufacturing method of a semiconductor device, preferably, when the semiconductor device is to be arranged such that a solder bonding layer is formed on the substrate and the semiconductor element is bonded onto the solder bonding layer through the solder layer, the solder bonding layer is formed by the cold spray method and subjected to an oxidation—reduction treatment, and then the outflow-preventing part is formed by the cold spray method.

In the above manufacturing method of a semiconductor device, preferably, when the semiconductor device is to be arranged such that a solder bonding layer is formed on the substrate and the semiconductor element is bonded onto the solder bonding layer through the solder layer, the solder bonding layer is formed by the cold spray method, the outflow-preventing part is faulted by the cold spray method using metal that is not reduced, and the solder bonding layer is subjected to an oxidation—reduction treatment after the outflow-preventing part is fowled.

In the above manufacturing method of a semiconductor device, preferably, when the semiconductor device is to be arranged such that a solder bonding layer is formed on the substrate and the semiconductor element is bonded onto the solder bonding layer through the solder layer, the solder bonding layer is formed on the substrate by the cold spray method, and a region on which the solder layer is to be located, of a surface of the solder bonding layer having been oxidized, is reduced by heat in a reducing gas so that a region left oxidized around the reduced region forms the outflow-preventing part.

In the above manufacturing method of a semiconductor device, preferably, when the semiconductor device is to be arranged such that a solder bonding layer is formed on the substrate and the semiconductor element is bonded onto the solder bonding layer through the solder layer, the solder bonding layer is formed on the substrate by the cold spray method and then subjected to an oxidation—reduction treatment, and a region surrounding the region on which the solder layer is to be located, of a surface of the solder bonding layer having been reduced, is oxidized by heat in an oxidizing gas so that the oxidized region forms the outflow-preventing part.

Effects of the Invention

According to the invention, an outflow-preventing part is formed by a cold spray method. This cold spray method can easily form a coat in the atmosphere. Therefore, a semiconductor device with a solder outflow-preventing structure faulted at low costs can be provided.

DESCRIPTION OF THE REFERENCE SIGNS

Figure 1:
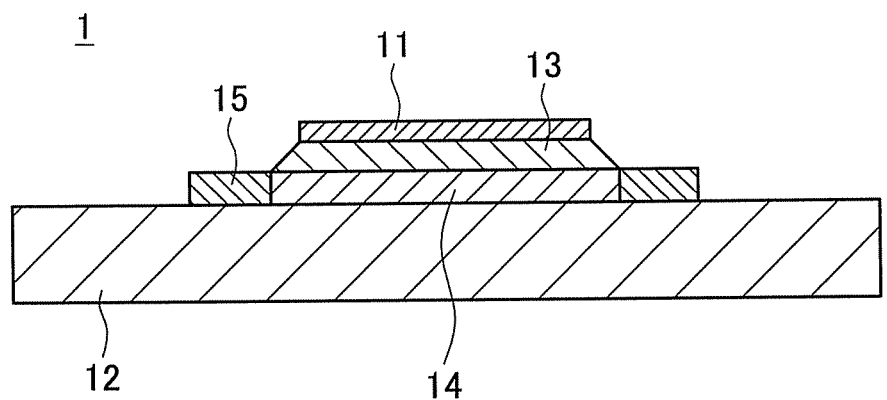
FIG. 1 is a cross sectional view of a semiconductor device in a first embodiment.

1 Semiconductor device
11 Semiconductor element
12 Substrate
13 Solder layer
14 Solder bonding layer
15 Outflow-preventing layer
91 First mask
92 Second mask

MODE FOR CARRYING OUT THE INVENTION

A detailed description of preferred embodiments of a semiconductor device and a manufacturing method thereof embodying the present invention will now be given referring to the accompanying drawings. FIG. 1 is a cross sectional view of a semiconductor device in a first embodiment. A semiconductor device 1 has a semiconductor element 11 such as IGBT mounted on a substrate 12 made of metal having good thermal conductivity and electric conductivity, such as aluminum or copper. The semiconductor element 11 and the substrate 12 are bonded by solder through a solder layer 13 for bonding the semiconductor element 11 and the substrate 12 while a solder bonding layer 14 is provided between the solder layer 13 and the substrate 12 to enhance solder bonding strength with respect to the substrate 12. Further, a back surface of a semiconductor element made of silicon is also subjected to a metalizing treatment using nickel alloy to improve bonding strength with solder.

The solder bonding layer 14 is Ruined of nickel, copper, tin, or others by a coating (film or layer forming) treatment such as a cold spray method, a plating method, vacuum deposition, or sputtering. However, in the case of using the plating method for coating, a surface has to be wholly masked excepting a part in which only the solder bonding layer 14 is to be formed. This needs time and costs. The vacuum deposition and the sputtering also need an expensive vacuum facility for coating and take long for vacuum exhaust and the like. Accordingly, productivity is poor and costs are high. In contrast, the cold spray method is effectively used in terms of easiness in partial coating, costs, treating time, and facility costs.

Figure 2:
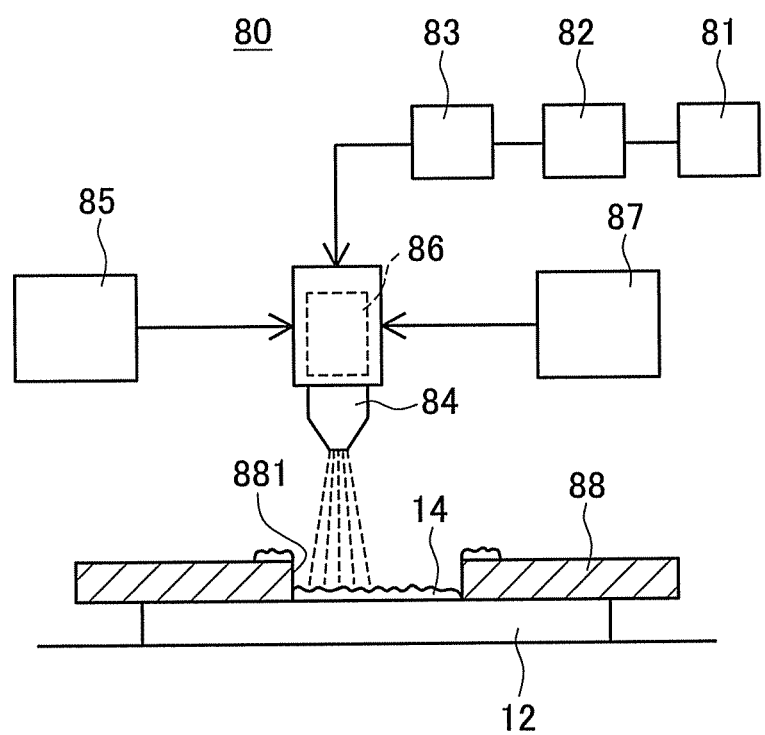
FIG. 2 is a conceptual diagram showing a structure of a coating device to carry out a cold spray method.

FIG. 2 is a conceptual diagram showing a structure of a coating device to carry out the cold spray method. A coating device 80 includes a compressor 81 for supplying compressed gas. This compressed gas supplied from the compressor 81 is heated in a heating unit 82 and then injected from a nozzle 84 via a pressure regulating valve 83. A powder tank 85 stores for example copper powder. The nozzle 84 is provided with a heater 86 to further heat the copper powder fed from the powder tank 85 into the nozzle 84. A drive unit 87 is provided to move the nozzle 84 in parallel in order to spray the copper powder onto a specified region to form a coat or film thereon.

When the solder bonding layer 14 is to be formed by the coating device 80, a mask 88 is placed on the substrate 12. This mask 88 includes an open frame 881 having a dimension corresponding to the region to be coated. The open frame 881 is disposed in place on the substrate 12. Copper powder having average particle diameter of 5 to 60 μm is supplied from the powder tank 85 to the nozzle 84. The copper powder is heated by the heater 86. Further, the compressed gas supplied from the compressor 81 and then heated is fed into the nozzle 84.

The copper powder in a solid phase state having been heated to 50° C. to 200° C. is sprayed swiftly together with the compressed gas onto the surface of the substrate 12 through the nozzle 84. A jet of copper powder in a solid state from the nozzle 84 collides against the substrate 12 at high velocities ranging from acoustic velocity to supersonic velocity, so that the copper powder is plastically deformed, sticking the substrate 12 and forming a coat thereon. When the copper powder collides, kinetic energy transforms into heat energy, so that material surfaces exceed a melting point depending on materials, bonding to the substrate 12, thereby obtaining strong adhesion force. By repeating the horizontal movement of the nozzle 84 to spray the copper powder all over the coating region, the solder bonding layer 14 with a predetermined thickness is formed on the substrate 12.

After the solder bonding layer 14 is formed by the cold spray method, the substrate 12 is put in a furnace and subjected to a heat treatment in a reducing gas atmosphere (e.g., in an atmosphere prepared by mixing 3% to 100% of hydrogen with argon gas, helium gas, nitrogen gas, or the like) and at a temperature of 200° C. to 700° C. When the solder bonding layer 14 is subjected to the heat treatment in the hydrogen-containing gas atmosphere, the oxidized layers of the surfaces of copper particles stuck and deposited as a coat are reduced, so that non-oxidized copper coats the surface of the layer 14. This enables soldering on the surface of the solder bonding layer 14. Conversely, solder is easy to wet-spread after the reduction treatment and thus solder outflow becomes an issue.

There is a difference in coefficient of linear expansion between silicon forming the semiconductor element 11 and copper foliating the solder bonding layer 14. Therefore, as the semiconductor device 1 is repeatedly used, shear stress caused by cold shocks acts on the solder layer 13 bonding the semiconductor element 11 and the solder bonding layer 14. The solder layer 13 is demanded for a fixed coating thickness or more so as to disperse the stress. Insufficient coating thickness may cause fatigue failure. If solder flows out of a predetermined region in which the solder should really stay for soldering the semiconductor element 11, the thickness of the solder layer 13 may be decreased. Therefore, such a coating thickness cannot provide sufficient stress dispersion. When solder is wet-spread in a wide region, the solder sticks to a connecting region of wire bond (not shown) located around the semiconductor element 11, resulting in a product failure.

Figure 3:
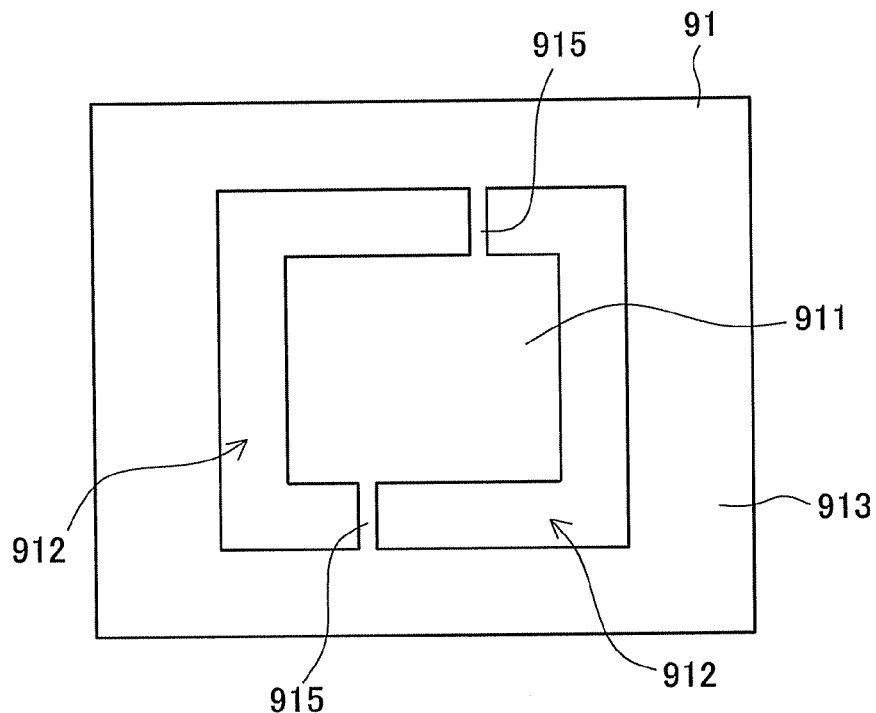
FIG. 3 is a view of a first mask to form an outflow-preventing layer.
Figure 4:
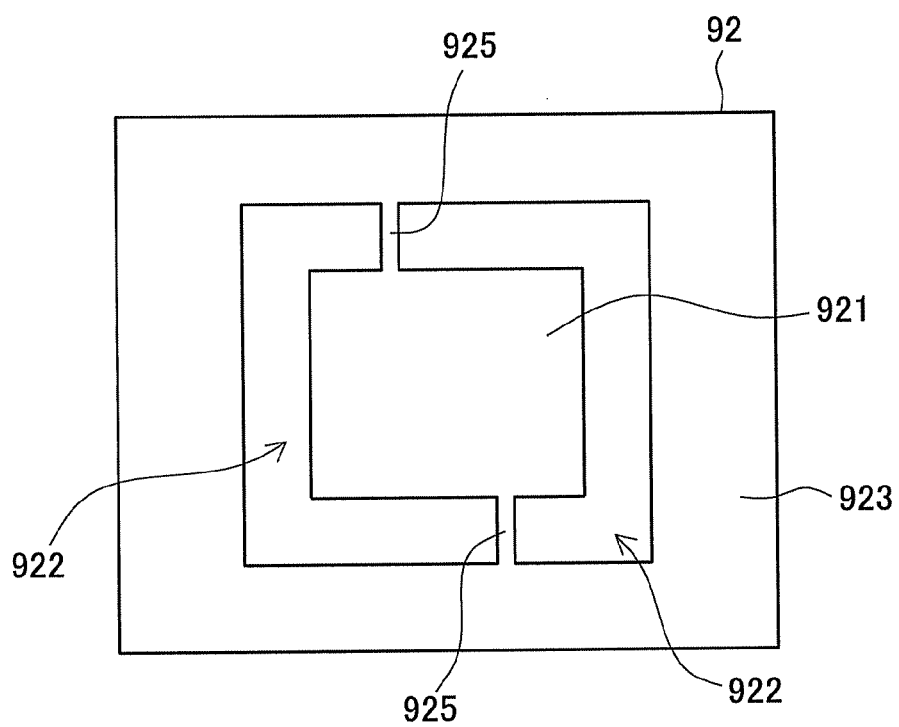
FIG. 4 is a view of a second mask to form an outflow-preventing layer.

In the semiconductor device 1, therefore, an outflow-preventing layer 15 for preventing outflow of solder is formed so as to surround the periphery of the solder bonding layer 14. The outflow-preventing layer 15 is formed, as with the solder bonding layer 14, by the cold spray method capable of forming at low costs. The outflow-preventing layer 15 is also formed by use of the coating device 80 but two masks are used therein as shown in FIGS. 3 and 4. A first mask 91 and a second mask 92 are formed respectively with openings 912 and 922 around center blocking portions 911 and 921 to cover the solder bonding layer 14. Outer circumferential blocking parts 913 and 923 are provided respectively outside the openings 912 and 922.

The openings 912 are separated by connecting portions 915 formed at two positions, without being provided annularly. The openings 922 are separated by connecting portions 925 formed at two positions, without being provided annularly. These are to connect the center blocking portion 911 or 921 to the outer circumferential blocking portion 913 or 923. Accordingly, if one mask is used alone, the outflow-preventing layer 15 that has to be formed in an annual shape is broken at the connecting portions 915 or 925. The first and second masks 91 and 92 are therefore designed so that respective connecting portions 915 and 925 are located in different positions from each other to place the connecting portions 915 and 925 in the other openings 922 and 912 if the masks 91 and 92 are overlapped.

Figure 5:
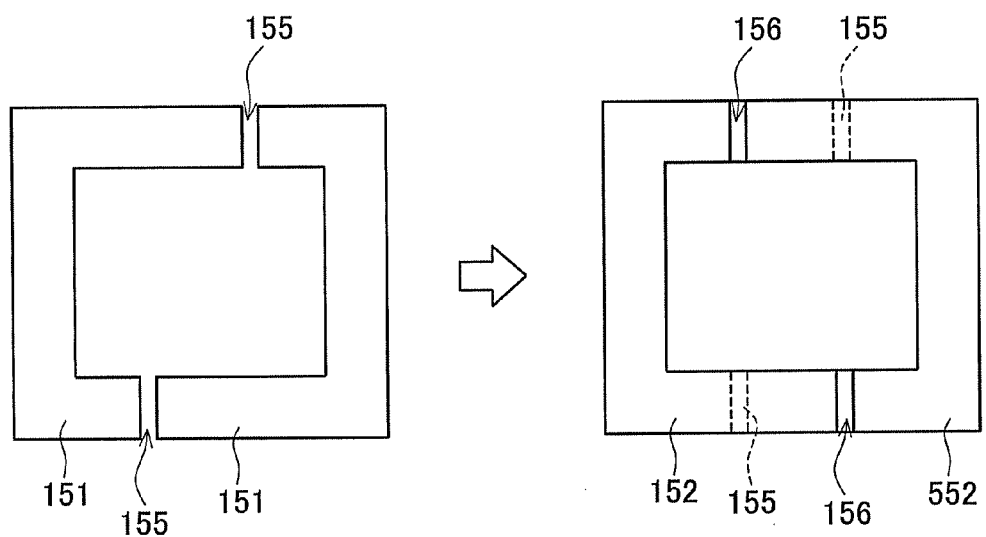
FIG. 5 is a plan view showing coating steps of forming the outflow-preventing layer stepwise.

To form the outflow-preventing layer 15, the first mask 91 shown in FIG. 3 is first put on the substrate 12 and positioned so that the center blocking portion 911 overlaps the solder bonding layer 14. Then, coating is performed according to the cold spray method using the coating device 80 shown in FIG. 2. Specifically, the copper powder sprayed swiftly from the nozzle 84 passes through the opening 912 and collides against the surface of the substrate 12, and the powder is plastically deformed and stuck thereon, thereby forming a coat or layer. The nozzle 84 is moved throughout the entire region of the openings 912 while spraying the copper powder. Thus, a first coat (layer) 151 shown in FIG. 5 is formed on the substrate 12. FIG. 5 is a plan view showing coating steps of forming the outflow-preventing layer 15 stepwise.

The first coat 151 has a planar shape corresponding to the openings 912 and includes two separate parts divided by slits 155 provided therebetween. After the first coat 151 is formed, the second mask 92 is set in place of the first mask 92 and then the copper powder is sprayed from the nozzle 84 again. Accordingly, a second coat (layer) 152 is formed on the first coat 151. At that time, the copper powder enters in the slits 155, filling in recesses respectively. On the other hand, the second coat 152 has a planar shape corresponding to the two openings 922 and is Banned with slits 156 at two positions. Thereafter, the first mask 91 is set in place of the second mask 92 to alternately perform the coating.

After the solder bonding layer 14 and the outflow-preventing layer 15 are formed on the substrate 12, the semiconductor element 11 is soldered on the solder bonding layer 14. That is, the semiconductor element 11 is laid on the solder bonding layer 14 through a solder material of a foil or pellet form and then heated to melt the solder material to conduct soldering. Since the copper forming the outflow-preventing layer 15 surrounding the solder bonding layer 14 is in an oxidized state, molten solder does not bond to the outflow-preventing layer 15 and hence the molten solder is not wet-spread more outward. Consequently, the solder layer 13 from which solder outflow is prevented can ensure a fixed coating thickness or more.

The present embodiment can provide the semiconductor device 1 with the outflow-preventing layer 15 formed at low costs by the use of the cold spray method. This is because the cold spray method enables easy coating in the atmosphere and also partial coating using the first and second masks 91 and 92 at low costs. With the use of the first and second masks 91 and 92, the outflow-preventing layer 15 can be formed in an annular shape with no cuts or slits, thereby further enabling prevention of solder outflow. Since the outflow-preventing layer 15 prevents solder outflow, a region allowing solder to wet-spread is restricted, and the solder will not reach a bonding region of wire bonding, thereby preventing bonding failures. In addition, the positional accuracy of the semiconductor element 11 can be enhanced.

Meanwhile, since the aforementioned first and second masks 91 and 92 are used alternately, the slits 155 and 156 of the outflow-preventing layer 15 are filled. However, it is conceivable that the first mask 91 is placed away from the substrate 12, allowing the sprayed copper powder to enter under the connecting portions 915 to connect the coated portions. In such a case, the slits 155 are not formed and thus the outflow-preventing layer 15 can also be formed by the use of only the first mask 91. Further, the slits 155 are locally provided and narrow in width. Accordingly, in the case where the solder will not flow in the slits 155 or wet-spreading of solder will not cause any problem in a product, the coating may be performed by the use of the first mask 91 alone.

The semiconductor device 1 includes the solder bonding layer 14 and the outflow-preventing layer 15 both formed of copper powder by the cold spray method. Therefore, the solder bonding layer 14 is first formed and subjected to the reduction treatment, and then the outflow-preventing layer 15 is formed but not subjected to the reduction treatment so that the layer 15 is left oxidized. On the other hand, in the case where the outflow-preventing layer 15 is formed of metal that is not reduced in the reduction treatment, such as aluminum, the solder bonding layer 14 and the outflow-preventing layer 15 after formed may be subjected together to the reduction treatment.

In the semiconductor device 1, the outflow-preventing layer 15 is made of copper and also may be made of a material with high specific gravity, high specific heat, and high thermal conductivity such as gold and silver as well as aluminum mentioned above. In the semiconductor device 1, the semiconductor element 11 acts as a heat generating body that will increase an amount of heat generated in use. With the outflow-preventing layer 15 having good thermal conductivity, allowing dispersion of heat and absorption of transient heat, a heat radiating performance of the entire semiconductor device 1 can be improved.

(Second Embodiment)

Figure 6:
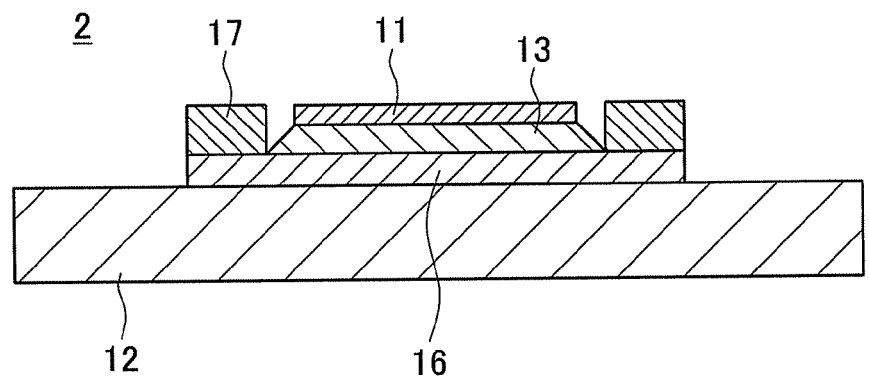
FIG. 6 is a cross sectional view of a semiconductor device in a second embodiment.

A second embodiment of a semiconductor device according to the present invention will be explained. FIG. 6 is a cross sectional view showing a semiconductor device in a second embodiment. Identical or similar parts to those in FIG. 1 are explained with the same reference signs as those in FIG. 1. A semiconductor device 2 is configured such that a solder bonding layer 16 is formed on a substrate 12 and further a semiconductor element 11 is bonded through a solder layer 13. The solder bonding layer 16 is formed with a larger area than that of the solder bonding layer 14 in the first embodiment so that an outflow-preventing layer 17 is formed on the solder bonding layer 16 in overlapping relation.

The solder bonding layer 16 is formed of nickel, copper, thin, or the like by a coating treatment such as the cold spray method, plating method, vacuum deposition, or sputtering. As in the first embodiment, the following explanation is also given to the solder bonding layer 16 made of copper powder by the cold spray method. The solder forming the solder bonding layer 16 tends to wet-spread because of the reduction treatment after coating (film or layer formation). Thus, the outflow-preventing layer 17 is formed to prevent solder outflow. This outflow-preventing layer 17 is fowled of copper powder by the cold spray method, with the use of the first and second masks 91 and 92 as shown in FIGS. 3 and 4.

The outflow-preventing layer 17 is formed like a wall surrounding the semiconductor element 11. Accordingly, for soldering, a solder material in a foil or pellet form and the semiconductor element 11 are placed in an overlapping manner inside a frame defined by the outflow-preventing layer 17. Therefore, the thickness of the outflow-preventing layer 17 is determined to be larger than at least the thickness of the solder layer 13 (100 to 400 μm). This is to prevent the solder material and the semiconductor element 11 from coming out of the outflow-preventing layer 17 without using any jig during transfer to a solder furnace. The outflow-preventing layer 17 having a sufficient height can hold back molten solder to prevent solder from flowing out during soldering. Further, since the outflow-preventing layer 17 prevents solder outflow in such a manner, a region allowing wet-spreading of solder is restricted, and thus improving the positional accuracy of the semiconductor element 11 to be bonded thereon.

The present embodiment can provide the semiconductor device 2 with the outflow-preventing layer 17 formed at low costs by use of the cold spray method as with the effects in the first embodiment. Further, the solder bonding layer 16 or the outflow-preventing layer 17, each being formed of copper with good thermal conductivity contributes to increasing volume and hence heat capacity, thereby improving heat releasing performance of the entire semiconductor device 2. Furthermore, the solder material and the semiconductor element 11 have only to be put inside the outflow-preventing layer 17 and do not need to be held up to completion of soldering. This makes it possible to eliminate the use of any jig or simplify production equipment. This configuration can also contribute to cost reduction.

(Third Embodiment)

Figure 7:
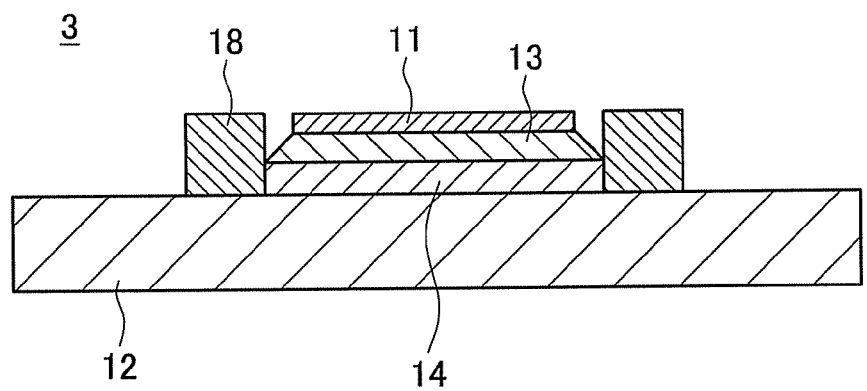
FIG. 7 is a cross sectional view of a semiconductor device in a third embodiment.

A third embodiment of a semiconductor device according to the present invention will be explained below. FIG. 7 is a cross sectional view of the semiconductor device in the third embodiment. Identical or similar parts to those in FIG. 1 are explained with the same reference signs as those in FIG. 1. A semiconductor device 3 is configured such that a solder bonding layer 14 is formed on a substrate 12, and further a semiconductor element 11 is bonded to the solder bonding layer 14 through a solder layer 13. The solder bonding layer 14 is fixated of copper powder by the cold spray method. The solder forming the solder bonding layer 14 tends to wet-spread because of the reduction treatment after coating. To prevent solder outflow, an outflow-preventing layer 18 is fowled around the solder bonding layer 14. The outflow-preventing layer 18 is formed of copper powder by the cold spray method using the first and second masks 91 and 92 shown in FIGS. 3 and 4 in the similar manner to the above embodiments.

The outflow-preventing layer 18 is directly formed on the substrate 12 and shaped like a wall surrounding the periphery of the semiconductor element 11. The thickness of the outflow-preventing layer 18 is determined to be higher than at least the solder layer 13 placed on the solder bonding layer 14.

Accordingly, the solder material and the semiconductor element 11 are less likely to come out of the outflow-preventing layer 18 even if any jig is not used during transfer to a solder furnace. The outflow-preventing layer 18 having a sufficient height can hold back molten solder to prevent solder outflow during soldering. In addition, since the outflow-preventing layer 18 prevents solder outflow, a region allowing wet-spreading of solder is restricted, thus improving the positional accuracy of the semiconductor element 11 to be bonded thereon.

As above, the present embodiment can also provide the semiconductor device 3 with the outflow-preventing layer 18 formed at low costs by use of the cold spray method as with the effects in the first embodiment. Further, the outflow-preventing layer 18 formed of copper with good thermal conductivity contributes to increasing volume and hence heat capacity, thereby improving heat releasing performance of the entire semiconductor device 3. Furthermore, the solder material and the semiconductor element 11 have only to be put inside the outflow-preventing layer 18 and do not need to be held up to completion of soldering. This makes it possible to eliminate the use of any jig or simplify production equipment. This configuration can also contribute to cost reduction.

(Fourth Embodiment)

Figure 8:
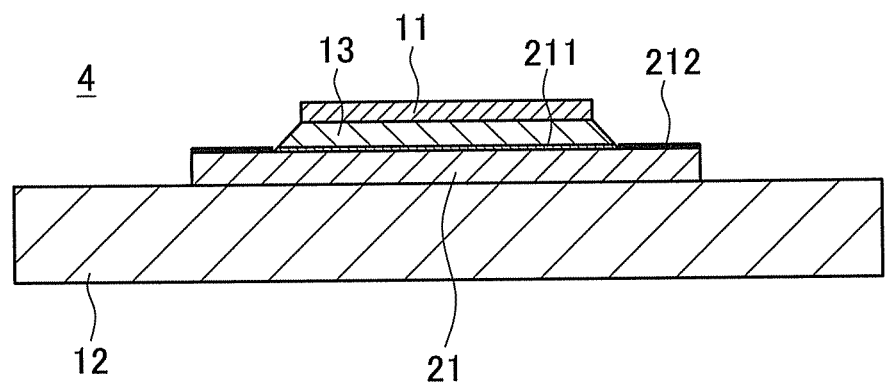
FIG. 8 is a cross sectional view of a semiconductor device in a fourth embodiment.

A fourth embodiment of the semiconductor device according to the present invention will be explained below. FIG. 8 is a cross sectional view of the semiconductor device in the fourth embodiment. Identical or similar parts to those in FIG. 1 are explained with the same reference signs as those in FIG. 1. A semiconductor device 4 is configured such that a solder bonding layer 21 is formed on the substrate 12 and further the semiconductor element 11 is bonded thereon through a solder layer 13. The solder bonding layer 21 is formed of copper powder by the cold spray method to have a larger area than the semiconductor element 11 and the solder layer 13.

Figure 9:
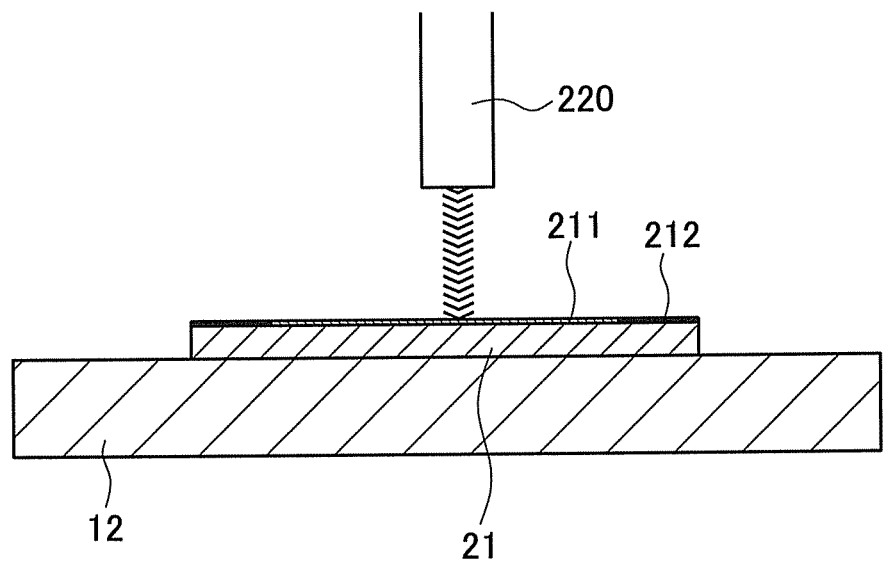
FIG. 9 is a conceptual drawing showing a partial reduction method.
Figure 10:
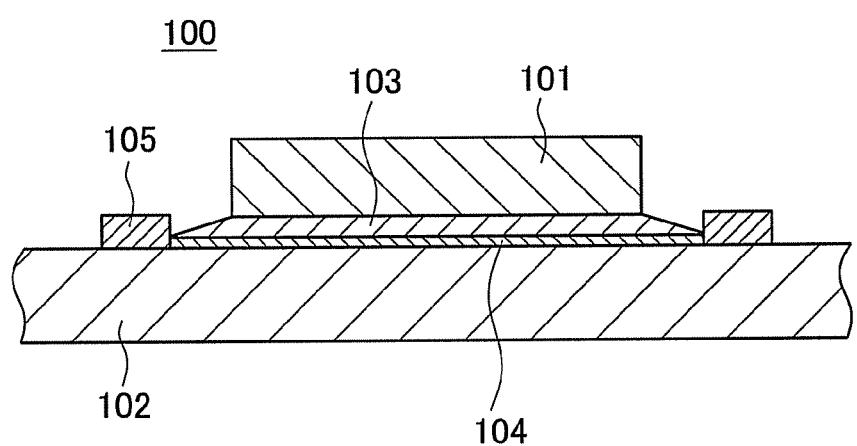
FIG. 10 is a cross sectional view of a conventional semiconductor device.

Since the solder bonding layer 21 is oxidized after coating, it does not directly allow soldering. On the other hand, if it is entirely reduced, it causes outflow of solder. In the present embodiment, therefore, the solder bonding layer 21 is partly subjected to a reduction treatment, leaving an oxidized portion, thereby preventing outflow of solder. Specifically, a reduced portion 211 is formed at a center region of the solder bonding layer 21 on which the solder layer 13 is to be provided. An oxidized portion 212 surrounding the reduced portion 211 and left oxidized serves as an outflow-preventing part. FIG. 9 is a conceptual diagram showing a partial reduction method.

The reduction treatment is performed by heat at a predetermined temperature in a reducing gas having a reducing property. In the reduction treatment in the present embodiment, the solder bonding layer 21 is put in the reducing gas such as hydrogen. As shown in FIG. 9, thereafter, a laser device 220 emits a laser beam in pulse mode to the surface of the solder bonding layer 21. The laser beam is irradiated only to the reduced portion 211 for a fixed time at each spot while shifting an irradiation site little by little. The laser in pulse mode has a sufficient energy for reduction at a laser irradiation point as high as 0.1 to 2.0 J/(cm$^2$·pulse) and is injected only for as short a time as 100 msec. Accordingly, only a portion irradiated by a laser beam is reduced, while a surrounding portion thereof is not reduced because a temperature rise is restrained.

A laser scanning speed, a pulse irradiation cycle, a beam diameter, a laser wavelength, and an irradiation surface reflectivity are appropriately determined according to the thickness of the solder bonding layer 21, surrounding structures thereof, and others. As the laser device 220, a $CO_2$ laser, a YAG laser, or a fiber laser is used. The reducing gas may be supplied as an ambient gas in a chamber or sprayed to a laser irradiation portion.

After the reduced portion 211 is formed in a predetermined region on the solder bonding layer 21, the semiconductor element 11 is placed on the reduced portion 211 through a foil-shaped or pellet-shaped solder material and then is heated for soldering. At that time, the oxidized portion 212 left as formed by the cold spray method exists around the solder material and thus it prevents solder outflow. The present embodiment can consequently provide the semiconductor device 4 with the solder bonding layer 21 formed at low costs by use of the cold spray method as being directly used as an outflow-preventing part for preventing solder outflow.

Although the above explanation is given to the method of partly reducing the solder bonding layer 21, the following explanation is made on a method of partly oxidizing the solder bonding layer 21 instead. In this method, after the solder bonding layer 21 is formed by the cold spray method on the substrate 12, the solder bonding layer 21 is first subjected to the reduction treatment by heating this layer 21 in the reducing gas. Thus, the entire solder bonding layer 21 is reduced, which is likely to cause solder outflow. Therefore, a part of the solder bonding layer 21 is subjected to an oxidation treatment. Specifically, the reduced portion 211 is left at the center of the solder bonding layer 21 and the oxidized portion 212 is formed as an outflow-preventing part around the reduced portion 211.

The oxidization treatment is performed by placing the solder bonding layer 21 in oxidizing gas containing oxygen and halogen gas having an oxidizing property. With respect to the solder bonding layer 21, as in the case shown in FIG. 9, a laser beam in pulse mode is irradiated from the laser device 220 to the surface of the solder bonding layer 21. In this example, however, sites corresponding to the oxidized portion 212 of the solder bonding layer 21 are irradiated. The laser beam in pulse mode has a sufficient energy for oxidization of each laser irradiation point and is injected only for a predetermined time. Accordingly, only a laser-irradiated portion is oxidized while the center portion is not oxidized. The oxidized portion 212 limited to an outer circumferential region has a smaller area than the reduced portion 211. This contributes to shortening of laser irradiation time.

Note that the laser scanning speed, pulse irradiation cycle, beam diameter, laser wavelength, and irradiation surface reflectivity are appropriately determined according to the thickness of the solder bonding layer 21, surrounding structures thereof, and others. As the laser device 220, a $CO_2$ laser, a YAG laser, a fiber laser, or others is used. The oxidizing gas containing oxygen in high concentrated amount and halogen is highly oxidative and thus may be diluted as needed. The oxidizing gas may be supplied as an ambient gas in a chamber or may be sprayed to a laser irradiation portion.

Consequently, the partial oxidization can also form the reduced portion 211 and the oxidized portion 212 in predetermined regions of the solder bonding layer 21. Thereafter, the semiconductor element 11 is put on the reduced portion 211 through foil-shaped or pellet-shaped solder and then heated for soldering. At that time, the oxidized portion 212 surrounds the solder, thus preventing outflow of the solder. In this manner, the semiconductor device 4 can be provided at low costs in which the oxidized portion 212 is formed on the solder bonding layer 21 made by the cold spray method and serves as the outflow-preventing part for preventing outflow of the solder.

The present invention is not limited to the above embodiments and may be embodied in other specific forms without departing from the essential characteristics thereof.

Each of the aforementioned embodiments explains the configuration that the outflow-preventing layer 15 and others are made of oxidized copper. As a material for coating by the cold spray method, aluminum, titanium, iron, silver, etc. may be used as long as it does not bond to solder and is not wetted.

In the first to third embodiments, the solder bonding layer 14 or 16 is formed. If the substrate 12 is made of copper, nickel, tin, or its alloy and allows direct bonding of solder thereto, the solder bonding layers 14 and 16 may be eliminated.

In the first to third embodiments, the method using the first and second masks 91 and 92 is explained to form the outflow-preventing layers 15, 17, and 18. As alternatives, it may be arranged such that a protection coat made of resin or the like is formed on the substrate 12 and the solder bonding layers 14 and 16 and the outflow-preventing layers 15, 17, and 18 are formed by the cold spray method, and then the protection coat is removed.

The substrate 12 may be formed of an insulating substrate using a ceramic plate.

The invention claimed is:

1. A method of manufacturing a semiconductor device by bonding a semiconductor element onto a substrate through a solder layer by soldering while preventing outflow of molten solder, the method comprising:
    forming an outflow-preventing part in a region surrounding the solder layer on the substrate by coating using a cold spray method, the outflow-preventing part having an oxidized surface, and
    soldering the semiconductor element by placing a solder material in a position surrounded by the outflow-preventing part and melting the solder material by heat.

2. The method of manufacturing a semiconductor device according to claim 1,
    wherein the method uses two masks, each mask being formed with an opening corresponding to the outflow-preventing part between a central blocking part corresponding to the solder layer and an outer circumferential part corresponding to an outer region surrounding the outflow-preventing part, and a connecting part extending across the opening to connect the central blocking part and the outer circumferential blocking part, the connecting parts of the masks being located in different positions from each other, and
    the method includes forming the outflow-preventing part by the cold spray method by alternately using the two masks.

3. The method of manufacturing a semiconductor device according to claim 1,
    wherein when the semiconductor device is to be arranged such that a solder bonding layer is formed on the substrate and the semiconductor element is bonded onto the solder bonding layer through the solder layer,
    the solder bonding layer is formed by the cold spray method and subjected to an oxidation—reduction treatment, and then the outflow-preventing part is formed by the cold spray method.

4. The manufacturing method of a semiconductor device according to claim 1,
    wherein when the semiconductor device is to be arranged such that a solder bonding layer is formed on the substrate and the semiconductor element is bonded onto the solder bonding layer through the solder layer,
    the solder bonding layer is formed by the cold spray method, the outflow-preventing part is formed by the cold spray method using metal that is not reduced, and the solder bonding layer is subjected to an oxidation—reduction treatment after the outflow-preventing part is formed.

5. The manufacturing method of a semiconductor device according to claim 1,
    wherein when the semiconductor device is to be arranged such that a solder bonding layer is formed on the substrate and the semiconductor element is bonded onto the solder bonding layer through the solder layer,
    the solder bonding layer is formed on the substrate by the cold spray method, and
    a region on which the solder layer is to be located, of a surface of the solder bonding layer having been oxidized, is reduced by heat in a reducing gas so that a region left oxidized around the reduced region forms the outflow-preventing part.

6. The manufacturing method of a semiconductor device according to claim 1,
    wherein when the semiconductor device is to be arranged such that a solder bonding layer is formed on the substrate and the semiconductor element is bonded onto the solder bonding layer through the solder layer,
    the solder bonding layer is formed on the substrate by the cold spray method and then subjected to an oxidation—reduction treatment, and
    a region surrounding the region on which the solder layer is to be located, of a surface of the solder bonding layer having been reduced, is oxidized by heat in an oxidizing gas so that the oxidized region forms the outflow-preventing part.

* * * * *

UNITED STATES PATENT AND TRADEMARK OFFICE
CERTIFICATE OF CORRECTION

PATENT NO.         : 8,865,584 B2
APPLICATION NO.    : 13/387910
DATED              : October 21, 2014
INVENTOR(S)        : Hirotaka Ohno It is certified that error appears in the above-identified patent and that said Letters Patent is hereby corrected as shown below:

In the Specification

At column 2, line 37, change "layer foamed" to -- layer formed --.

At column 4, line 3, change "faulted at low" to -- formed at low --.

At column 4, line 58, change "14 is Ruined" to -- 14 is formed --.

At column 5, line 56, change "copper foliating" to -- copper forming --.

At column 6, line 55, change "and is Banned with" to -- and is formed --.

At column 8, line 10, change "17 is fowled of" to -- 17 is formed of --.

At column 8, line 54, change "fixated of copper" to -- formed of copper --.

At column 8, line 58, change "fowled around" to -- formed around --.

Signed and Sealed this
Twenty-first Day of July, 2015

Michelle K. Lee
*Director of the United States Patent and Trademark Office*